(12) United States Patent
Udrea

(10) Patent No.: US 12,665,589 B2
(45) Date of Patent: Jun. 23, 2026

(54) INTEGRATED CIRCUIT COMPRISING A HOTSPOT DETECTION CIRCUIT

(71) Applicant: Cambridge GaN Devices Limited, Cambridge (GB)

(72) Inventor: Florin Udrea, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 179 days.

(21) Appl. No.: 18/394,078

(22) Filed: Dec. 22, 2023

(65) Prior Publication Data

US 2025/0211221 A1 Jun. 26, 2025

(51) Int. Cl.
| | |
|---|---|
| *H03K 17/082* | (2006.01) |
| *H10D 64/00* | (2025.01) |
| *H10D 89/60* | (2025.01) |
| *H10W 40/00* | (2026.01) |
| *H03K 17/08* | (2006.01) |
| *H10D 30/47* | (2025.01) |
| *H10D 62/85* | (2025.01) |

(52) U.S. Cl.
CPC ....... *H03K 17/0822* (2013.01); *H10D 64/112* (2025.01); *H10D 89/60* (2025.01); *H10W 40/00* (2026.01); *H03K 2017/0806* (2013.01); *H10D 30/475* (2025.01); *H10D 62/8503* (2025.01)

(58) Field of Classification Search
CPC .. H03K 17/082; H03K 17/08; H03K 17/0822; H03K 2017/0806; H01L 23/34; H01L 27/02; H01L 29/20; H01L 29/40; H01L 29/778; H10D 64/112; H10D 30/475; H10D 62/8503; H10D 84/05

USPC .......................................... 361/93.7–93.9, 103
See application file for complete search history.

(56) References Cited

U.S. PATENT DOCUMENTS

| | | | |
|---|---|---|---|
| 10,818,786 B1 | 10/2020 | Udrea et al. | |
| 2008/0237772 A1* | 10/2008 | Stecher ................. | H10D 89/60 |
| | | | 438/54 |
| 2011/0156799 A1* | 6/2011 | Zanardi ................. | G01K 13/00 |
| | | | 327/512 |
| 2015/0270254 A1 | 9/2015 | Risbud | |
| 2019/0140630 A1* | 5/2019 | Chen ................ | H03K 17/08104 |

(Continued)

OTHER PUBLICATIONS

Luxembourg Search Report (English and Luxembourgish) for LU application No. 505894, dated Aug. 1, 2024, 8 pages.

(Continued)

*Primary Examiner* — Danny Nguyen
(74) *Attorney, Agent, or Firm* — Tarolli, Sundheim, Covell & Tummino LLP

(57) ABSTRACT

An integrated circuit comprising: a III-nitride high-electron-mobility transistor (HEMT) comprising a source terminal, a gate terminal, and a drain terminal; a hotspot detection circuit comprising a temperature sensor, the temperature sensor being configured to sense a localized temperature of the III-nitride HEMT; and a protection circuit; wherein the hotspot detection circuit is configured, upon sensing by the temperature sensor of an increase in the localized temperature of the III-nitride HEMT, to transmit a hotspot detection signal to the protection circuit; and wherein the protection circuit is configured, upon receipt of the hotspot detection signal, to cause a current between the source terminal and the drain terminal to be reduced.

18 Claims, 7 Drawing Sheets

(56) References Cited

U.S. PATENT DOCUMENTS

| | | | |
|---|---|---|---|
| 2019/0286181 A1* | 9/2019 | Iwamizu | H10D 84/811 |
| 2020/0132558 A1* | 4/2020 | Chern | G01K 7/183 |
| 2020/0144969 A1 | 5/2020 | Mahon et al. | |
| 2022/0208761 A1 | 6/2022 | Udrea et al. | |
| 2023/0358787 A1* | 11/2023 | Isakharov | G01R 1/07378 |
| 2024/0170943 A1* | 5/2024 | Li | H03K 17/122 |

OTHER PUBLICATIONS

Saumitra: "Ultrafast Discrete Short-Circuit Protection for GaN HEMTs," GaN HEMTs' Protection Circuits—Power Electronics News, Feb. 28, 2023, 6 pgs.
Hedayati et al: "Overtemperature Protection Circuit for GaN Devices Using a di/dt Sensor," IEEE Transactions on Power Electronics, 36(7), 7417-7428, https://doi.org/10.1109/TPEL.2020.3041594.
Schmitz et al: "Rugged and fast short circuit detection method for GaN HEMT based on saturation detection," CIPS 2022; 12th International Conference on Integrated Power Electronics Systems, Berlin, Germany, 2022, pp. 313-318.
Search and Examination Report for GB application No. GB2417727.1, dated Jun. 3, 2025, 5 pages.

* cited by examiner

INTEGRATED CIRCUIT COMPRISING A HOTSPOT DETECTION CIRCUIT

TECHNICAL FIELD

The present disclosure relates to an integrated circuit comprising a III-nitride high-electron-mobility transistor (HEMT), the integrated circuit comprising a hotspot detection circuit.

BACKGROUND

Gallium Nitride (GaN) is a wide band gap material with properties that make it a suitable candidate for use in several fields of application (e.g. radio-frequency electronics, opto-electronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems.

Additionally, GaN with its wide bandgap offers the potential for emitting light at higher frequencies for example the green, blue, violet, and ultraviolet portions of the electro-magnetic spectrum.

Gallium Nitride (GaN) has been more recently considered as a very promising material for use in the field of power devices. The application areas range from portable consumer electronics, solar power inverters, electric vehicles, and power supplies. The wide band gap of the material (Eg=3.39 eV) results in high critical electric field (Ec=3·μV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters. One common parameter used to compare power semiconductor transistors is Specific ON-state resistance or Specific Rds(ON). Where specific Rds(ON) is often the product of the resistance of a device times the area of the device on wafer. An extensive amount of research has focused on the development of power devices using AlGaN/GaN heterostructures.

Layers which constitute the AlGaN/GaN heterojunction transistor are often epitaxially grown on a substrate from a different material for example Silicon (Si), Silicon Carbide (SiC) or Sapphire. Epitaxial growth of GaN on different substrates has advantages and disadvantages both in terms of the complexity and cost of growing high quality layers and in terms of device performance. A non-exhaustive list of things to consider when choosing a suitable substrate is: substrate lattice constant mismatch with GaN, substrate thermal expansion coefficient mismatch with GaN, substrate cost, substrate thermal conductivity etc.

Silicon is a popular option due to the low cost and availability of Silicon substrates. Use of Silicon as a substrate however comes with some disadvantages. Silicon and GaN have a large lattice constant mismatch and a large thermal coefficient mismatch. A transition layer is used to facilitate the growth of high quality GaN epitaxial layers on Silicon. A transition layer often comprises graded AlN/AlGaN layers or a 'superlattice'. A GaN buffer layer is grown on the transition layer. The GaN buffer layer is often carbon doped to limit vertical leakage from the surface high voltage terminal e.g. drain and the substrate back-end contact. An unintentionally doped GaN layer is then grown where the two dimensional electron gas at the interface with an AlGaN barrier layer is present.

However, the 2DEG which inherently exists at the AlGaN/GaN hetero-interface creates a challenge when attempting the design of enhancement mode rather than depletion mode devices. Nonetheless, several methods have been proposed which can lead to enhancement mode devices, among them the use of metal insulator semiconductor structures, use of fluorine treatment, recessed gate structures and use of a p-type cap layer. Due to the relative maturity and controllability in the epitaxial growth of pGaN layers compared to the other techniques, pGaN/AlGaN/GaN HEMTs are currently the leading structure for commercialization. The high-frequency operation of GaN helps designers to increase the power density of devices, which in turn increases the system efficiency and results in cost savings. But the increased frequency of operation also results in challenges for designing short-circuit and overcurrent protection circuits for these GaN HEMTs. In addition, in motor control applications enhanced short-circuit endurance is highly desirable. For example, in a half bridge configuration when the low-side and high side devices operate at different times in ON and OFF states, if due to a fault both devices are ON, a short-circuit may be present. This may be detected and a signal can be transmitted to the controller/driver to turn devices off.

The traditional methods for short-circuit protection in silicon-based power devices such as IGBTs, using for example a desaturation circuit which senses when the device is in saturation, have a delay time of in the range of 2-10 μs, which is too high for GaN HEMTs [1]. GaN HEMTs can fail under short circuit condition at high dc-link voltages in several hundred nanoseconds [2]. A shunt current-sensing resistor adds additional parasitic inductance into the circuit, which can negatively affect the switching performance of the GaN HEMTs as well as the on-state losses. Voltage sensing across common source inductance (or resistance) is not practical for GaN, as active steps are taken to reduce stray inductance in a GaN circuit to improve switching performance and at the same time not compromise on-state losses. Therefore, alternative methods for short-circuit and overcurrent protection are desirable for GaN devices. Recent prior-art proposes a discrete short-circuit/overcurrent circuit for protection, but they are either limited to low-power circuits, are too slow, or require additional components which increase the bill of material and the system complexity. Monolithic integration of such functionality rather than a discrete implementation would allow a reduction in the overall system size/costs, a reduction in the bill of material and would lead to improved performance through the reduction of parasitic components associated with the interconnections between discrete devices. Furthermore, the reaction time would be much faster and more easily predictable.

The document U.S. Ser. No. 10/818,786, the contents of which is hereby incorporated by reference, describes an over-current protection and sensing circuitry utilising a current sense transistor (SENSE HEMT) that may be integrated monolithically with the main power switch [3]. The Sense HEMT can communicate with a Miller clamp (another HEMT transistor) to lower the voltage on the gate of the GaN power HEMT.

The operation of GaN power HEMTs in overload conditions implies extreme temperature due to self-heating. It is critical to monitor over temperature conditions to avoid the failure or damage of the power devices. A general practice in the industry is to place temperature sensing chips on the board, as close as possible to the switching devices, or, in systems using modules, the modules would often include a thermistor attached to the substrate. The temperature reading signals are fed back to the controller and calibrated for a critical temperature point. This method only works for gradual temperature rises and could have significant error in the case of sharp temperature rises [4].

The high current through the power device during a short-circuit condition results in creating hotspots within or in the immediate vicinity of the 2DEG channel under the gate. This is because the 2DEG channel sees a large power dissipated when the current is in full saturation under short-circuit condition. Such hotspots can have a transient peak temperature well above the maximum junction temperature and higher than the temperature in surrounding areas. Detection of undesirable hotspots and controlling the operation of the power device electrically can be an effective and a prompt way of protecting the power device from short-circuits, over-current and over-temperature conditions.

SUMMARY

It is desirable for robust and reliable operation of the GaN power IC, to have a (i) fast and rugged short-circuit and overtemperature or hotspot temperature detection and (ii) protection via a feedback mechanism method.

It is an object of this invention to describe a short-circuit and/or over temperature protection circuit that uses minimal components and provides ultra-fast protection in short-circuit conditions or against temperature and current spikes.

As described herein, a "hotspot" may comprise a (e.g. localized) region of increased temperature of a HEMT. E.g. an increase in temperature relative to an area surrounding the region.

Described herein is an integrated circuit (IC) comprising:
a III-nitride high-electron-mobility transistor (HEMT) comprising a source terminal and a drain terminal;
a hotspot detection circuit comprising a temperature sensor (or temperature sensing device), the temperature sensor (or temperature sensing device) being configured to sense a localized temperature of the III-nitride HEMT; and
a protection circuit;
wherein the hotspot detection circuit is configured, upon sensing by the temperature sensor (or temperature sensing device) of an increase in the localized temperature of the III-nitride HEMT, to transmit a hotspot detection signal to the protection circuit; and wherein the protection circuit is configured, upon receipt of the hotspot detection signal, to cause a current between the source terminal and the drain terminal to be reduced.

The III-nitride HEMT may be referred to as a "power HEMT".

The III-nitride HEMT may also comprise a gate terminal.

A "III-nitride" transistor (e.g. HEMT), device, or integrated circuit, as used herein, may refer generally to a transistor or device based on the group III-nitride family of materials, including GaN, AlN, InN, and alloys thereof.

It will be understood that, in some examples described herein, the terms "circuit" and "block" may be used equivalently.

For example, the hotspot detection circuit and/or the temperature sensor may be configured to sense whether a temperature in a particular region of the III-nitride HEMT rises above a threshold temperature. The hotspot detection circuit may be configured to transmit the hotspot detection signal to the protection circuit when the sensed temperature is above the threshold temperature.

The hotspot (localized heating) may occur due to an abnormal condition, and generally occurs in an active area of the III-nitride HEMT.

The protection circuit may be configured to control the III-nitride HEMT directly to cause the current between the source terminal and the drain terminal to be reduced, and/or the protection circuit may act on the III-nitride HEMT indirectly via one or more other components, circuits, or devices and/or turn-off the III-nitride HEMT.

Preferably, the hotspot detection circuit is monolithically integrated with III-nitride HEMT.

Preferably, the protection circuit is monolithically integrated with the III-nitride HEMT. This may provide increased reaction speed and eliminate the need for external components.

Alternatively, the protection block may be placed outside the III-nitride (e.g. GaN) chip and provided in a silicon chip. In such case, the protection block may comprise circuits such as comparator, bandgap reference-based temperature sensor, voltage regulator and blanking RC type devices.

The III-nitride HEMT may comprise a two-dimensional carrier gas layer in which a two-dimensional carrier gas, such as a two-dimensional electron gas (2DEG) or a two-dimensional hole gas (2DHG) may be able to form.

A center of the hotspot (localized heating) may occur within or close to the two-dimensional carrier gas layer, in some or many cases. Therefore, in some examples, the temperature sensor is configured to detect the increase in the localized temperature in the two-dimensional carrier gas layer. For example, the temperature sensor may be positioned in, or close to, the two-dimensional carrier gas layer. For example, 'close to' may refer to a distance <2 μm.

Preferably, the temperature sensor should be positioned in a region close to a gate of the III-nitride HEMT. For example, 'close to' may refer to a distance <5 μm.

For example, as described herein, the hotspot may occur in a location in proximity to the gate terminal, and/or between the gate terminal and the drain terminal. For example, the temperature sensor may be configured to detect the localized temperature in a location between the gate terminal and the drain terminal. In some examples, the temperature sensor may be located within a distance of less than 5 μm from the gate terminal.

The hotspot can occur due to a short-circuit event. The hotspot detection circuit may be configured to detect a short-circuit. The protection circuit may comprise a short-circuit protection block. In such a short-circuit condition the III-nitride HEMT may operate in saturation under both high current and high voltage stress.

The temperature sensor (or temperature sensing device) may comprise a resistive temperature detector (RTD). The resistive temperature detector may comprise a metal layer.

In some examples, the temperature sensor (or temperature sensing device) comprises a two-dimensional carrier gas resistor layer (e.g. a 2DEG or 2DHG resistor layer).

In some examples, the metal layer and/or the two-dimensional carrier gas resistor layer may be formed in a same process step as any metal or two-dimensional carrier gas layers of the III-nitride HEMT and/or the integrated circuit.

The temperature sensing device may comprise one or more of a HEMT, a diode configured like a HEMT, a p-n diode, and/or a Schottky type diode. The HEMT(s) and/or the diode(s) may be part of the GaN Power IC library process.

In some examples, a differential measure between the output of a first temperature sensor or sensing device (placed near the hotspot) and second temperature sensor or sensing device (placed far from the hotspot) may be used to determine the output of the hotspot detection circuit.

A ΔT between the hotspot temperature and a temperature outside the hotspot or a ΔT between the hotspot temperature and reference temperature, such as ambient temperature, could be used to determine the output of the hotspot detection circuit. Optionally, the temperature outside the hotspot area is within the IC (within the same chip) and can be sensed by a second matched or similar temperature sensing device.

For example, the temperature sensor (or temperature sensing device) described above may be referred to as a first temperature sensor, and the integrated circuit may comprise a second temperature sensor. The second temperature sensor may be configured to sense a reference temperature. The hotspot detection circuit may be configured to transmit the hotspot detection signal based on a difference between the localized temperature and the reference temperature.

For example, the second temperature sensor may be located further from the hotspot (the location of the localized temperature) than the (first) temperature sensor.

By "far from the hotspot", it is meant a location within the GaN chip (GaN power IC) that is not affected or is less affected by the heat source produced during an event such as short-circuit. Such location would have a much lower temperature than that in the hotspot and would be more representative of the temperature before the short-circuit event started. Examples of such location for the temperature sensor placed far from the hotspot, could be outside the active area of the high voltage HEMT, or adjacent to the source metal but at a distance from the gate metal.

The second temperature sensor may equivalently be referred to as a reference temperature sensor, or a reference temperature sensing device, or a second temperature sensing device.

In some examples, the hotspot detection circuit may be configured to transmit the hotspot detection signal when the difference between the localized temperature and the reference temperature exceeds a threshold amount. As described herein, the reference temperature may correspond to an ambient temperature.

The ΔT may be translated into a ΔV (voltage difference), e.g. by the hotspot detection circuit, which when above a reference voltage level, may transmit a signal to the protection block as to lower the gate voltage of the Power HEMT.

The temperature sensor (i.e. first temperature sensor) and the second temperature sensor may be arranged in a bridge structure, e.g. a Wheatstone bridge. In some examples, a bridge structure may comprise a plurality of first temperature sensors and a plurality of second temperature sensors.

The hotspot detection may comprise a comparator configured to receive a first temperature signal from the (first) temperature sensor, and a second temperature signal from the second temperature sensor. The hotspot detection circuit may be configured to transmit the hotspot detection signal based on an output of the comparator.

The integrated circuit may comprise one or more capacitors arranged in parallel or in series with the (first) temperature sensor and/or the second temperature sensor. In some examples, the capacitor may form part of a resistor-capacitor (RC) network. The RC network may be arranged in parallel or in series with the (first) temperature sensor and/or the second temperature sensor.

The inclusion of a capacitor may advantageously add a blanking time and eliminate false triggering of the short-circuit detection.

In some examples, the protection circuit comprises a pull-down device (e.g. a pull-down transistor) such as a Miller clamp. The pull-down device (transistor) may be connected between the gate terminal and the source terminal of the III-nitride HEMT. The pull-down device (transistor) may be configured, upon receipt of the hotspot detection signal by the protection circuit, to turn-on. For example, the pull-down device (transistor) may be configured to partially or fully turn-on when the protection circuit receives the hotspot detection signal.

In some examples, the protection circuit comprises an interface circuit, or at least part of an interface circuit. For example, the protection circuit may comprise an auxiliary gate interface circuit. The gate terminal of the III-nitride HEMT may be operatively connected to a control terminal via the auxiliary gate interface circuit. The auxiliary gate interface circuit may be configurable to adjust a voltage applied to the control terminal. For example, the auxiliary gate interface circuit may be configurable to adjust the voltage applied to the control terminal to be operatively compatible with the gate terminal.

The auxiliary gate interface circuit may be configured to adjust the voltage applied to the control terminal upon receipt by the protection circuit of the hotspot detection signal.

In some examples, the hotspot detection circuit further comprises a sense HEMT. The sense HEMT may have a smaller active area and/or gate width than the III-nitride (power) HEMT, but be otherwise identical in structure to the III-nitride (power) HEMT. For example, the sense HEMT may have a scaled down N:1 active area and/or gate width relative to the III-nitride (power) HEMT.

BRIEF DESCRIPTION OF THE DRAWINGS

The present invention will now be described by way of example with reference to the following drawings.

DETAILED DESCRIPTION

Figure 1:
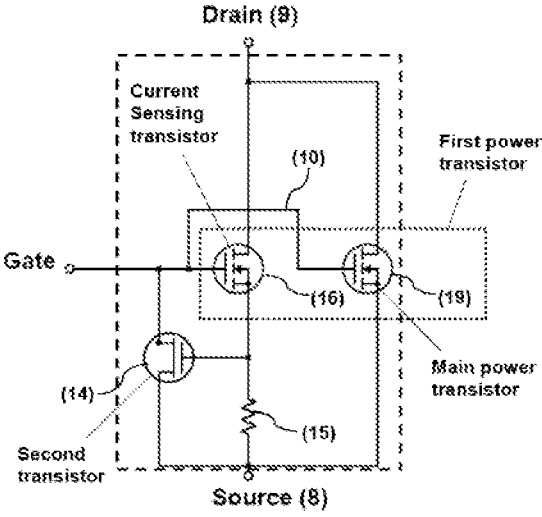
FIG. 1 illustrates a schematic circuit diagram of an over-current protection circuit according to U.S. Ser. No. 10/818,786B1.

FIG. 1 illustrates a schematic circuit diagram of an over-current protection circuit according to U.S. Ser. No. 10/818,786B1 (the contents of which is hereby incorporated by reference), comprising a resistor and an actively switched low voltage depletion mode transistor (second transistor) controlling the potential on the gate terminal of the main power transistor. The second transistor acts as a Miller clamp. The over-current protection circuit includes a first power transistor 19, a current sensing transistor 16, a depletion mode transistor (second transistor) 14, and a current sensing resistor 15.

The circuit acts to lower or limit the gate voltage on the first power transistor 19, when a condition of over drain current is detected in the current sensing transistor 16, by using the depletion mode device 14 and the resistor 15 or resistive element described above. If a condition of over-current is detected the voltage drop across current sensing resistor 15 increases and thus the voltage bias on the gate terminal of transistor 14 increases causing a sharp decrease in resistance of transistor 14. This provides a reduction in the resistance of the path between the gate and source of the first power device 16, 19 thus limiting the potential on the first gate terminal.

Figure 2:
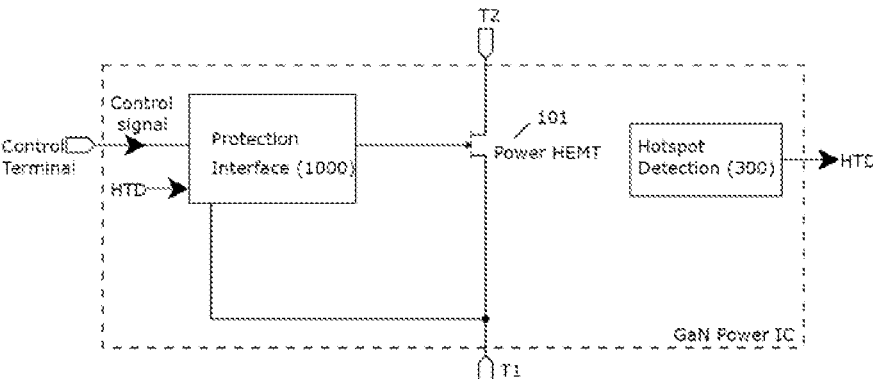
FIG. 2 illustrates a schematic example of an integrated circuit according to the present disclosure.

FIG. 2 illustrate a schematic example of an integrated circuit according to the present disclosure, featuring a high-voltage III-nitride power HEMT 101 (main power HEMT), a hotspot detection circuit 300 which is monolithically integrated near the power HEMT, and a protection circuit 1000. In an example according to the present disclosure, the hotspot detection circuit 300 is configured, upon detection by the hotspot detection circuit 300 of an increase in the localized temperature of the power HEMT, to transmit a hotspot detection signal HTD to the protection circuit 1000. The protection circuit may be configured, to receive the hotspot detection signal HTD, and cause a current between the source terminal and the drain terminal of the power HEMT to be reduced.

Figure 3:
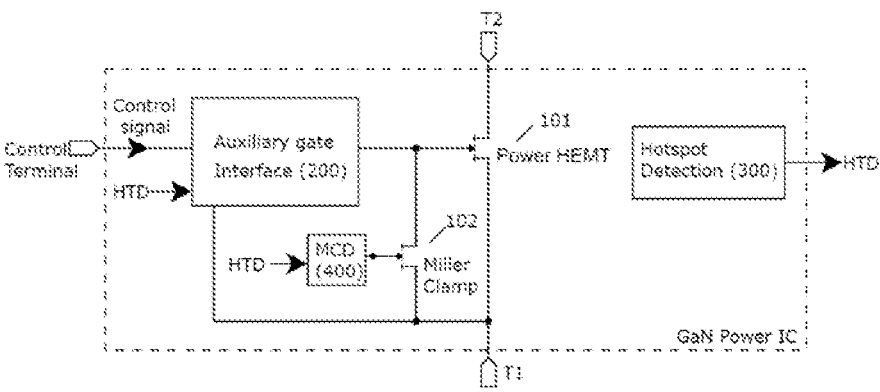
FIG. 3 illustrates a schematic example of an integrated circuit according to the present disclosure.

FIG. 3 illustrates a schematic example of an integrated circuit according to the present disclosure, featuring a high-voltage III-nitride power HEMT 101 (main power HEMT), an auxiliary gate interface circuit 200 which has at least one connection to a control terminal and at least one connection to the internal gate of the high voltage HEMT and a hotspot detection circuit 300 which is monolithically integrated near the power HEMT, preferably near the gate controllable region of the 2DEG. In an example according to the present disclosure, the III-nitride power HEMT is a high voltage lateral GaN HEMT. The interface circuit 200 also referred as an auxiliary gate interface circuit is placed in front of the gate of the high voltage lateral GaN HEMT to adapt the driving voltage of the control terminal to that suitable and allowable for the GaN HEMT. This interface could be preferably monolithically integrated with the power HEMT for providing lower parasitics, ease of manufacturing and fast reaction time. Alternatively, this interface could be part of a separate chip (such as a silicon companion chip, or a driver chip). The driving voltage on the control terminal could be from 0V to 20 V while the driving voltage seen directly by the gate terminal of the lateral high voltage GaN HEMT remains 0 to 7V. The auxiliary gate interface 200 may contain a short-circuit protection function. The interface may further contain other clamping circuits, sensing and protection functions such as control terminal over-voltage and over-temperature protection circuits. The Miller clamp 102 is a pull-down device to ensure a fast and safe turn-off, to enhance immunity against dV/dt and to avoid the need for using negative gate voltages to turn-off the power HEMT.

During a short-circuit event, or during an abnormal condition, the power HEMT may operate in saturation with a maximum current corresponding to a given internal gate voltage, and a high voltage between its main terminals (source and drain). The V*I power dissipated by the HEMT becomes very high, especially in the 2DEG region under the gate, but also extending to the rest of the 2DEG which could be in quasi-saturation. The device heats up very fast, with a hot spot developing in the 2DEG area under the gate and extending in its immediate surrounding.

According to the present disclosure a hotspot detection block (a circuit which detects an abnormally high temperature in a hot spot region of the device) 300 may be provided in the vicinity of the hot spot. This block may comprise a temperature sensitive component (temperature sensor) such as a resistive temperature detector (RTD), or a HEMT device as a discrete component or as a combination of these components in any configuration. The RTD can be made of a metal or a 2DEG resistor that would see an increase in the resistance when the temperature rises within the hotspot. The RTD could be made of a layer already existing in the process. The RTD could be placed just above the gate or next to the gate and isolated from other metal layers or semiconductor via insulating materials. An alternative to a metal layer could be a 2DEG layer or a HEMT based on a 2DEG layer. As the temperature increases the 2DEG resistance increases significantly due to the decrease in the electron mobility.

The HEMT resistance also increases in the presence of temperature while the saturation current decreases with the increase in temperature due to the electron mobility degradation in the 2DEG layer. The threshold voltage of HEMT generally increases with temperature but its behaviour is less stable and predictable than for example that of the mobility of the 2DEG. The temperature sensitive component may also be driven or controlled by the same gate signal (inner gate—Gin) as the power HEMT 101 as shown in FIG. 4.

The hotspot detection block may comprise a temperature comparison circuit that would compare the temperature across the temperature sensitive component with respect to a threshold temperature value and is configured to change its output signal—Hotspot Temperature Detection signal (HTD) when a temperature beyond the threshold value is detected around the power HEMT (more specifically around the 2DEG area), for example yielding a low output signal when a hotspot temperature is not detected and a high output signal when a hotspot temperature is detected, hence indicating a short-circuit is detected or an abnormal event with excessive self-heating is detected. This Hotspot Temperature Detection signal (HTD) may act as an input to the auxiliary gate interface block such that the auxiliary gate interface block acts to turn-off the power HEMT or regulate the voltage on the gate terminal of the power HEMT to a reduced voltage. Reducing the bias of the gate terminal of the power HEMT may be beneficial in extending the time for which the power HEMT can survive a short circuit event, as a reduced gate bias can lead to reducing the saturation current of the power HEMT in a short circuit condition, thereby controlling the heating of the device. Additionally, a Miller clamp transistor (102) may be connected between the gate and the source of the power HEMT. In another example, the output signal of the hotspot detection block 300 may act directly (or indirectly through a further additional block) as an input to the gate of the Miller clamp transistor (or the gate driver of the Miller clamp transistor—MCD) such that the Miller clamp turns-on and hence turning-off the power HEMT when a short circuit is detected (or an abnormal event which leads to excessive self-heating).

Figure 4:
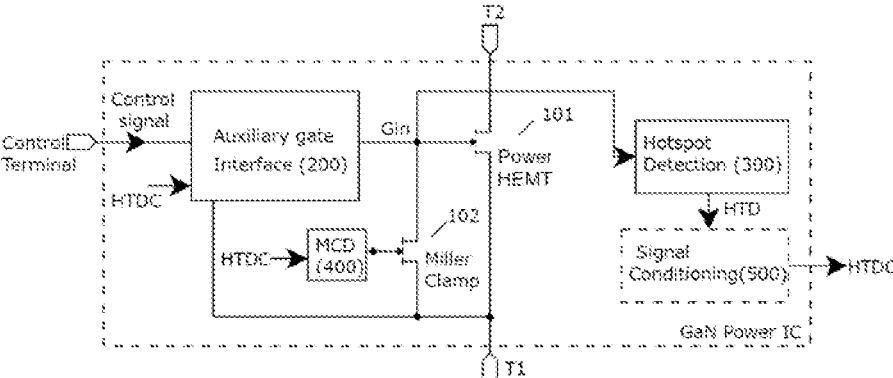
FIG. 4 illustrates an example of an integrated circuit in which a temperature sensitive component is driven or controlled by a same gate signal as the HEMT.

The output of the hotspot detection block may be applied directly to the aforementioned circuit blocks or may be applied indirectly via some additional circuit blocks, generically termed as signal conditioning block (500) as shown in FIG. 4. As an example, the signal conditioning block may comprise a time control circuit, a time-base latch circuit, a temperature-based hysteresis circuit, and/or any other signal conditioning circuits. Embodiments of these additional circuit blocks will be described herein. As an example, these additional circuit blocks may be monolithically integrated with the power HEMT device forming a GaN Power IC.

The threshold temperature value may be set at different levels to detect short-circuit events and over temperature conditions and therefore, the same circuit may provide protection against both short-circuit and over temperature conditions.

Figure 5:
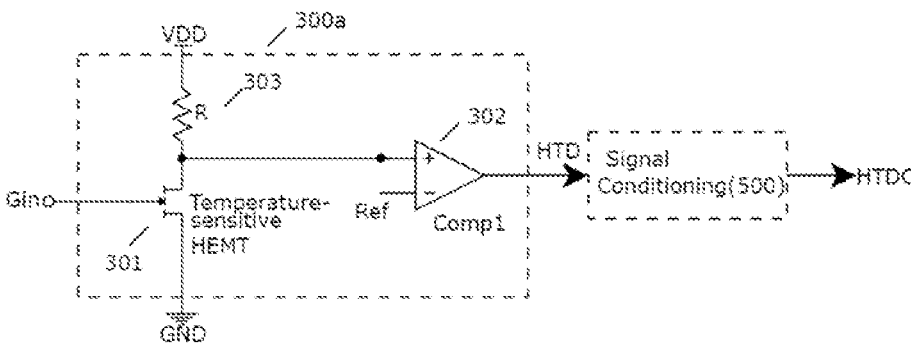
FIG. 5 illustrates an example of the hotspot detection circuit according to the present disclosure.

FIG. 5 illustrates an example of the hotspot detection block according to an aspect of the present disclosure. Hotspot detection block 300a comprises a discrete temperature-sensitive HEMT device 301 which is driven by the gate voltage same as the gate voltage of the power HEMT 101 and this device 301 is located near the power HEMT 101. A resistive component 303 may be connected between the voltage supply and the drain of the HEMT 301. The resistive component may be made up of SiChrome (SiCr) that has a precise and stable operation at high temperatures, or the resistive component may be replaced by a constant current source. When the temperature in the temperature sensing HEMT, 301 increases (as it is placed in the vicinity of a hot spot), the voltage drop across the drain-source terminals of the HEMT 310 transistor increases. When this reaches a reference value, the comparator sends a signal out HTD which could be further processed by the signal conditioning circuit 500. Other examples of discrete devices that may be incorporated in the block 300 may include a 2DEG device placed near the channel of the power HEMT, a metal based RTD placed above or near the 2DEG channel of the power HEMT (and preferably in the vicinity of the gate structure and isolated from other metals layers and the semiconductor by insulting material) etc.

Figure 6:
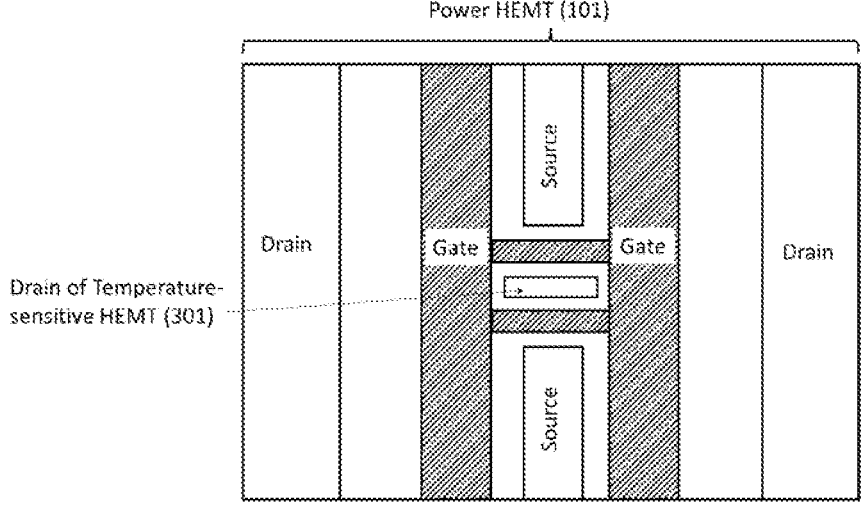
FIG. 6 illustrates an example of how a low voltage temperature-sensitive HEMT may be placed near the HEMT.

FIG. 6 illustrates an example of how a low voltage temperature-sensitive HEMT that may be placed near the power HEMT. The example shows that the temperature-sensitive HEMT shares with the power HEMT common gate and source terminals but different drain terminals. This transistor could be placed at the edge of a finger or in the middle of the finger. The layout in this example may offer the advantage of protection of the temperature-sensitive HEMT from the high electric fields present in the power HEMT, during its OFF-state operation, while maintaining close proximity to where the hotspot would form in a short circuit condition. Alternatively, the low voltage temperature-sensitive HEMT may be isolated or partly isolated from the power HEMT, but still placed near where the hot spot occurs.

10

Figure 7:
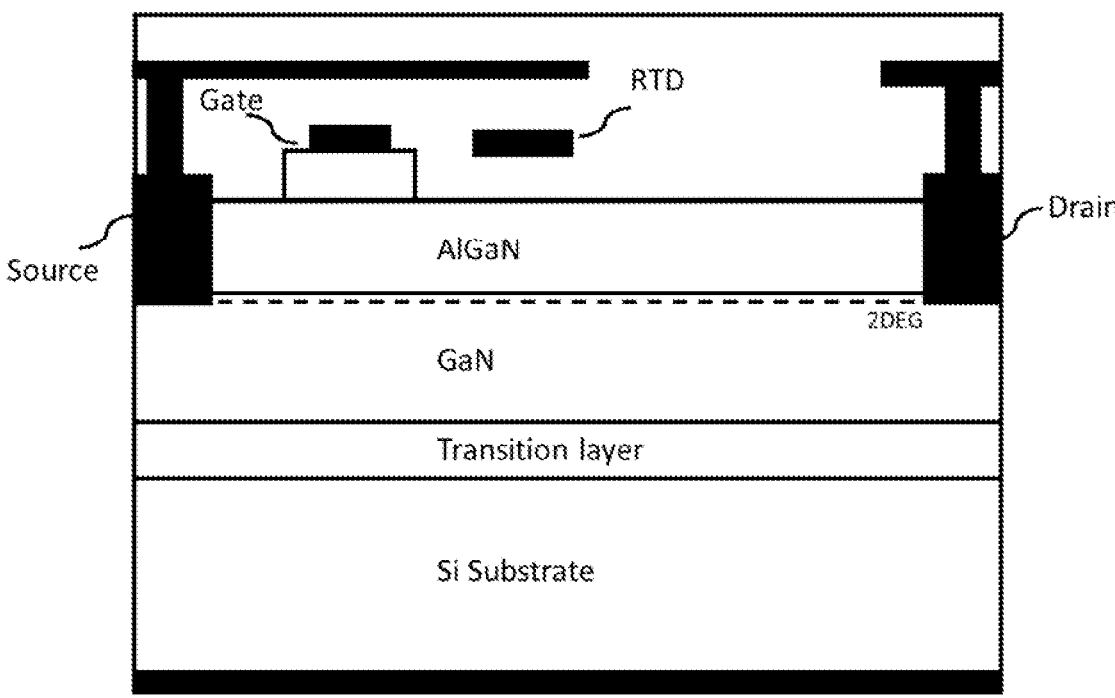
FIGS. 7 and 8 show possible designs of an RTD in the vicinity of the gate or sandwiched between the gate metal and a field plate metal connected to source.
Figure 8:
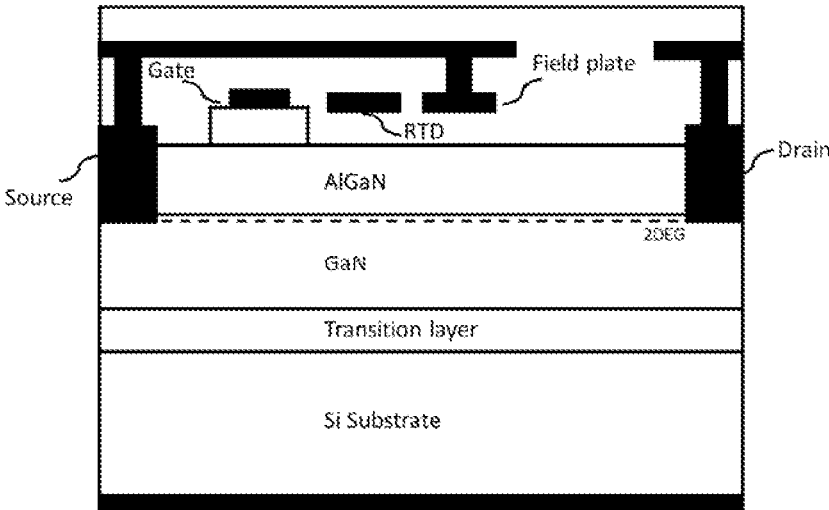
Figure 9:
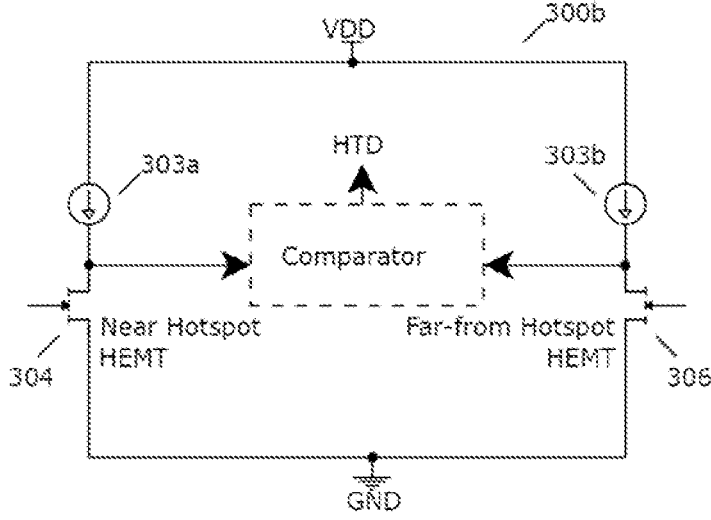
FIGS. 9 to 11 illustrate further examples of hotspot detection circuits according to the present disclosure.

FIG. 7 and FIG. 8 show possible designs of an RTD (field plate 2) in the vicinity of the gate or sandwiched between the gate metal and a field plate metal connected to source. The RTD can run alongside (partly or fully) the source and gate fingers of a power HEMT. The placement of the RTD in these examples may offer the advantage of being in very close proximity to the region where the hotspot would occur, thus offering a large temperature differential (AT) with ambient temperature before the hotspot occurs and/or with regions outside the hotspot. This can offer faster and more reliable detection of an abnormal event such as a short circuit occurring. In these examples, the RTD is placed between the gate and drain terminal of the power HEMT, a region which experiences fast changes in potential when the power HEMT is switching. The field plate metals may be designed to shield the RTD from picking up signals due to parasitic capacitances in the power HEMT when the power HEMT is switching. Additionally, some capacitance may be connected across the RTD in this example to provide some immunity to the parasitic signals during switching and thus prevent false triggering of the hotspot detection circuit.

Figure 10:
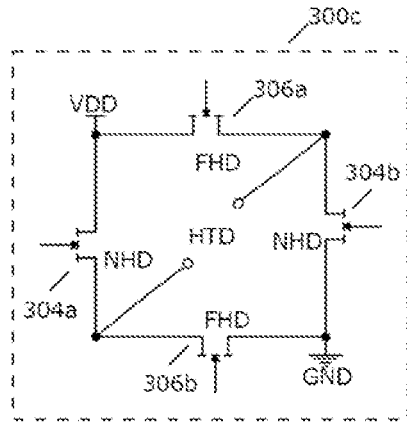

FIG. 10 illustrates another example of the hotspot detection block according to an aspect of the present disclosure. The hotspot detection block 300b is configured to perform a differential mode of hotspot detection. A temperature sensitive HEMT 304 similar to the device 301 is placed near the power HEMT and may be called as a Near Hotspot Device (NHD). Another temperature-sensitive HEMT 306 identical to and having the same process variation as the HEMT 304 may be located far from the power HEMT so that it is far from the hotspot location and may be called as the Far-from Hotspot Device (FHD). A differential signal from these 2 devices would largely cancel out the effect of the ambient temperature and provide a relative signal that would be a more accurate representation of a short circuit event which is characterised by a localised hot spot. The current sources 303a and 303b could be used as a pair of mirrored current sources. The voltage drop difference is then fed to a comparator circuit that gives an output HTD. When the hot spot temperature exceeds the far-from hotspot temperature a signal difference is produces between the inputs into the comparator. If this difference is larger than a certain margin, an HTD output is produced which is then used in the Auxiliary gate interface 200 or MCD 400 (FIGS. 2 and 3) to lower the internal gate voltage of the power HEMT and hence lower the saturation current of the power HEMT or turn-off the power HEMT. The circuit shown in FIG. 7 may have other arrangements. The Near Hotspot and Far-from Hotspot HEMTs may be replaced by a near hotspot RTD or a near hotspot 2DEG and far-from hotspot RTD or far-from hotspot 2DEG respectively.

This type of differential arrangement allows the differential detection of the temperature due to self-heating in an area close to the 2DEG.

Multiple 304 transistors could be placed in different locations where hotspots could develop for example for more precise detection of such hotspots.

Capacitors could be placed in parallel with the transistors 304 and 306 to control the transient time constant at which an event is identified as a short-circuit event. That is to say that until such capacitors are charged to a certain voltage no short-circuit could be detected (similar to a blanking time circuit).

The transistors 304 and 306 could be placed by near hotspot 2DEG or RTD and far-from hotspot 2DEG or RTD.

Alternatively any of the transistors 304 or 306 could be operated in a diode mode with the gate short-circuited to the source.

The far-from hotspot structures mentioned above (2DEG resistors, RTDs, HEMT) could be placed in area far from the power HEMT. Besides the power HEMT, the GaN chip could contain other integrated circuit blocks (such as interface block, ESD protection circuits). The far-from hotspot structure could be placed for example in the vicinity of such integrated circuit blocks.

FIG. 10 illustrates another example of the hotspot detection block according to an aspect of the present disclosure. The hotspot detection block 300c is arranged in in a bridge configuration to perform a differential mode of hotspot detection. Here, two Near Hotspot Devices (NHD) and two Far-from Hotspot Devices (FHD) may be arranged in a bridge configuration. This configuration would also cancel the effect of the ambient temperature and provide a relative signal that would be a more accurate representation of the hotspot temperature that would subsequently be compared with the threshold temperature value to accordingly update the HTD signal.

Different bridge circuits could be used (current driven, voltage driven, with one or multiple hotspot temperature sensing elements). Capacitors could be added in any side of the bridge to control the reaction time in case of an overheating or short-circuit event. This could help reduce the noise issues and false triggering of the short-circuit detection.

The bridge could be connected to a lower level voltage rail to reduce the power consumption. Alternatively the bridge could be operated in stand-by mode when the gate is not active.

The HTD signal from any of the hotspot detection blocks 300a, 300b or 300c may be passed through the signal conditioning block (500) to generate a HTDC signal similar to FIG. 4.

Figure 11:
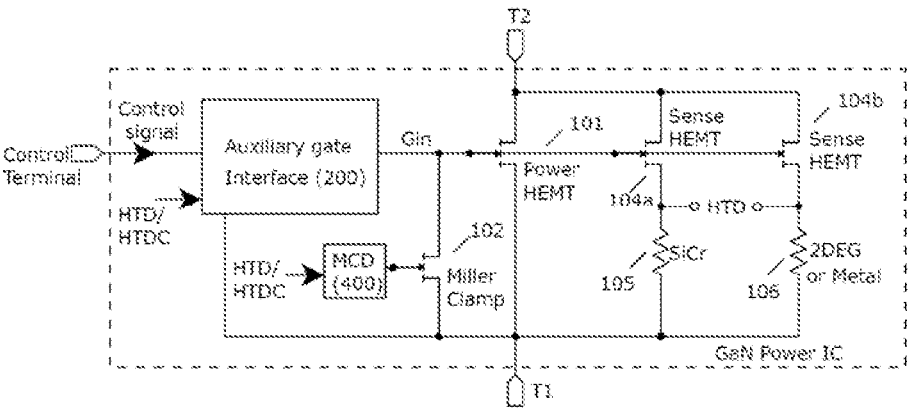

FIG. 11 illustrates another example of hotspot detection near the power HEMT. Two sense HEMTs are connected in parallel to the power HEMT to get an estimate of the drain current of the power HEMT. One of the sense HEMTs has a SiCr resistor connected to its source as the sensing load while the other sense HEMT has a 2DEG or a metal resistor connected as the sensing load. In case of a short-circuit event, SiCr resistor would be thermally stable than the 2DEG resistor and the resistance of the 2DEG resistor would vary largely with the increase in temperature at the hotspot near the power HEMT. Hence for the same drain current, the voltage across the resistor 105 would be different than the voltage across the resistor 106 due to their different temperature coefficients. A difference of these two signals would provide an estimation of the hotspot and comparing this with a threshold can update the HTD signal accordingly. This signal may be passed through the signal conditioning block (500) to generate a HTDC signal similar to FIG. 4. The HTD/HTDC signal may be applied to auxiliary gate interface and/or the Miller clamp drive as described in FIG. 3 to provide a short-circuit protection function.

Figure 12:
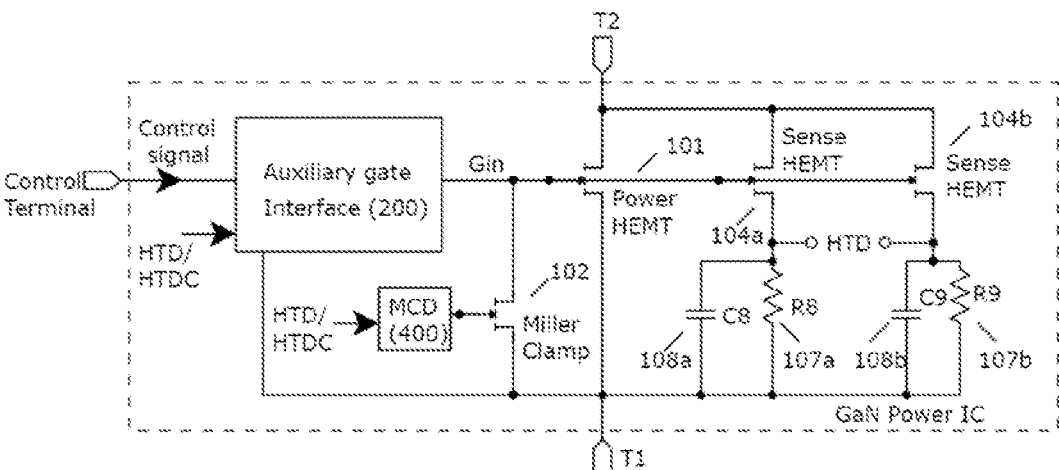
FIG. 12 illustrates a further example of an integrated circuit according to the present disclosure.

FIG. 12 illustrates a further example of an integrated circuit according to the present disclosure. In the example of FIG. 12, there is provided a power HEMT, two SENSE HEMTs (identical in structure to the power HEMT, but with a scaled down N:1 active area or gate width), one near hotspot metal RTD or 2DEG and one far from the hotspot metal RTD or 2DEG. The RTD near the hotspot could be placed between the gate metallization and the drain metallization, nearer the gate. It could be next or under the field plate. The RTD far from the hotspot could be placed outside the area of the power HEMT (high voltage HEMT) or could be placed below the source metal or next to source metal, but at distance from where the hotspot forms, near the gate metal. When a hotspot is detected, having a temperature in excess of a certain threshold value when compared to a far from the hotspot area on the same GaN chip (GaN Power IC), a voltage drop difference is seen across the two resistors (one near the hotspot 107a and one the far from the hotspot 107b). In this way, a ΔT between the temperature of the hotspot and the temperature far from the hotspot is translated into a ΔV. When the ΔV is in excess of a certain threshold value, the HTD (High Temperature Detector circuit) sends a signal to the protection circuit which could act on the auxiliary interface (for example on the voltage limiter of the AUX HEMT illustrated in FIG. 14) and/or on the Miller clamp circuit as to turn-on or softly (gradually) turn-on the Miller clamp. As a result, the internal gate voltage of the HEMT could be lowered as to reduce the current from source to drain. It is worth noting that the voltage drop difference seen across the two resistors (one near the hotspot 107a and one the far from the hotspot 107b) is proportional to the resistance difference and also approximately proportional to the current in the Sense HEMT which at its turn is approximately proportional to the current of the power HEMT. In normal operation, at nominal current, this voltage drop difference is below or well below the threshold value necessary to trigger the HTD signal. Only when the current is relatively high and when the resistance difference between the RTD near hotspot and the RTD far from hotspot is high, the HTD signal is triggered. This configuration is effective as false triggering during normal on-state operation is avoided. Moreover, when the device is in the off-state, the power consumption through the Sense HEMTs is negligible and the voltage drop difference HTD is zero and therefore the detection circuit is not active.

To further avoid false triggering during the transient signals, capacitors 108a and 108b could be placed in parallel (or in a an RC network—not shown) with the RTD resistors 107a and 107b to create a blanking time (only trigger the HTD signal after a certain blanking time has lapsed from the start of the SC event). The blanking time could for example be in the range of tens or hundreds of nanoseconds.

This implementation is particularly effective in increasing the endurance time during the short-circuit (both short-circuit type 1 and type 2) as the saturation current of the power HEMT could be reduced (or completely brought to zero) when the hotspot temperature increases above a certain threshold value.

Figure 13:
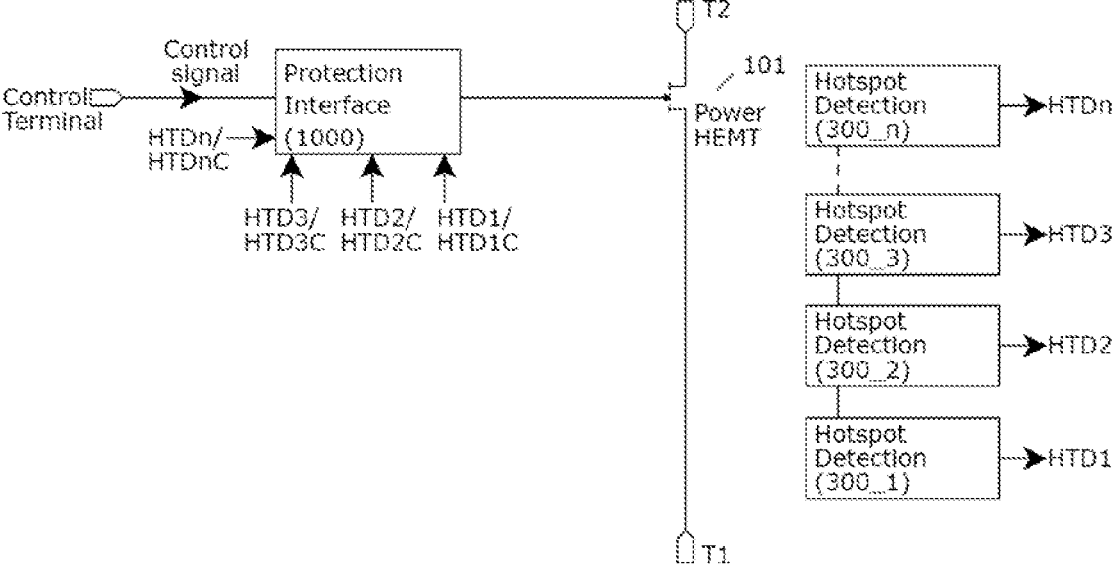
FIG. 13 illustrates a further schematic example of an integrated circuit according to the present disclosure.

FIG. 13 illustrates another aspect of the present disclosure. The short-circuit detection and protection may be performed through a series of hotspot detection and protection phases rather than a single hotspot detection step. Each hotspot detection circuit may include a temperature sensor at a relatively different location with respect to the power HEMT generating a series of HTD signals. These signals may act on the auxiliary gate interface to regulate the gate voltage of the power HEMT or on the Miller clamp to pull down the power HEMT. The benefit of having multiple signals is that the signal coming from the detection block with lower threshold temperature and/or relatively distant location to the gate of the power HEMT may regulate the gate voltage by a lesser extent than the signal coming from the detection block with higher threshold temperature and/or relatively closer location to the gate of the power HEMT. Thus, this provides a mechanism of gradual regulation of the operation of the power device and avoid a sudden and complete turn-off of the device at the inception of the short-circuit or abnormal event. If the short-circuit event persists for a longer time and beyond a certain limit the power HEMT can be completely pulled down. The HTD blocks 300_1 to 300_n may be implemented based on any of the previous embodiments.

Figure 14:
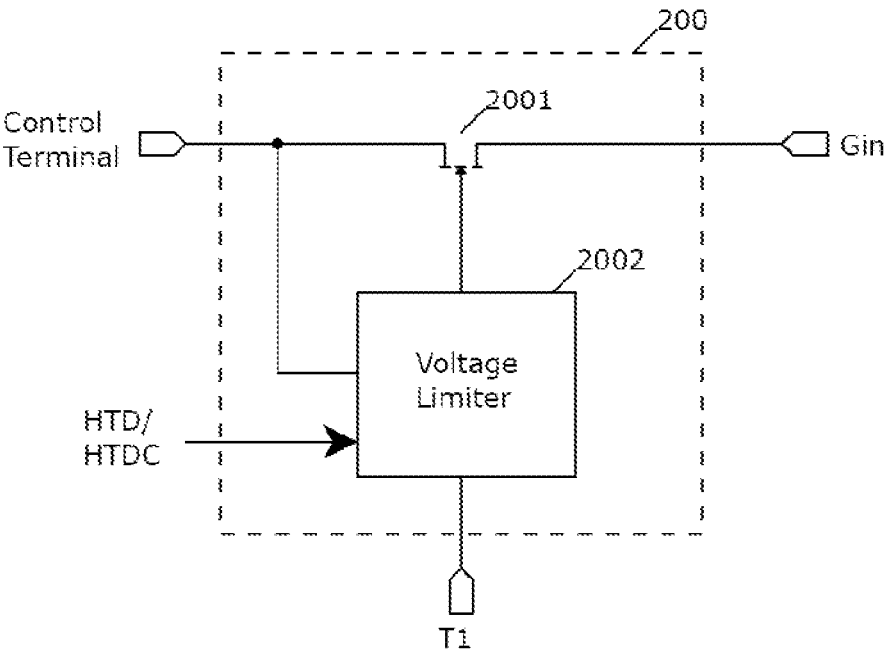
FIG. 14 illustrates a schematic example of an auxiliary gate interface.

FIG. 14 illustrates an example of an Auxiliary gate interface 200 which comprise an auxiliary gate HEMT (or AUX HEMT) 2001 and a voltage limiter 2002. The auxiliary gate HEMT may be a low voltage GaN HEMT in front of the gate of the power HEMT to absorb any differences in the voltage between the voltage applied to the control terminal (which for example could go up to 20 V) and that of the gate of the power HEMT (which for example could only go up to ~7 V). The voltage limiter can limit the voltage on the gate terminal of the auxiliary gate HEMT and therefore limit the voltage on the gate terminal of the power HEMT. HTD/HDTC signal could act on the voltage limiter to adjust the voltage limit of the gate terminal of the power HEMT, for example reduce the voltage limit when a hotspot is detected. Furthermore, the addition of the low voltage GaN HEMT allows for an increase in the threshold voltage (wherein the threshold voltage in this context may refer to the voltage applied between the control terminal and the power HEMT source terminal) at which the power HEMT turns-on.

It will be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

REFERENCES

[1] https://www.powerelectronicsnews.com/ultrafast-discrete-short-circuit-protection-for-gan-hemts

[2] J. Schmitz et al., "Rugged and fast short circuit detection method for GaN HEMT based on saturation detection," CIPS 2022; 12th International Conference on Integrated Power Electronics Systems, Berlin, Germany, 2022, pp. 1-6.

[3] U.S. Ser. No. 10/818,786B1

[4] M. H. Hedayati et al., Overtemperature Protection Circuit for GaN Devices Using a di/dt Sensor, IEEE TRANSACTIONS ON POWER ELECTRONICS, VOL. 36, NO. 7, JULY 2021

The invention claimed is:

1. An integrated circuit comprising:

a III-nitride high-electron-mobility transistor (HEMT) comprising a source terminal, a gate terminal, a drain terminal, and a two-dimensional carrier gas layer;

a hotspot detection circuit comprising a temperature sensor, the temperature sensor being configured to sense a localized temperature of the III-nitride HEMT, wherein the temperature sensor is configured to detect the localized temperature in the two-dimensional carrier gas layer; and a protection circuit;

wherein the hotspot detection circuit is configured, upon sensing by the temperature sensor of an increase in the localized temperature of the III-nitride HEMT, to transmit a hotspot detection signal to the protection circuit; and wherein the protection circuit is configured, upon receipt of the hotspot detection signal, to cause a current between the source terminal and the drain terminal to be reduced.

2. The integrated circuit according to claim 1, wherein the hotspot detection circuit is monolithically integrated with the III-nitride HEMT.

3. The integrated circuit according to claim 1, wherein the protection circuit is monolithically integrated with the III-nitride HEMT.

4. The integrated circuit according to claim 1, wherein the temperature sensor is configured to detect the localized temperature in a location between the gate terminal and the drain terminal.

5. The integrated circuit according to claim 1, wherein the temperature sensor is located within a distance of less than 5 μm from the gate terminal.

6. The integrated circuit according to claim 1, wherein the hotspot detection circuit is configured to detect a short-circuit.

7. The integrated circuit according to claim 1, wherein the temperature sensor comprises a resistive temperature detector.

8. The integrated circuit according to claim 1, wherein the temperature sensor comprises a two-dimensional carrier gas resistor layer.

9. The integrated circuit according to claim 1, wherein the temperature sensor comprises one or more of:

a HEMT;

a diode;

a p-n diode; and/or a Schottky diode.

10. The integrated circuit according to claim 1, comprising a second temperature sensor, the second temperature sensor being configured to sense a reference temperature, and wherein the hotspot detection circuit is configured to transmit the hotspot detection signal based on a difference between the localized temperature and the reference temperature.

11. The integrated circuit according to claim 10, wherein the temperature sensor and the second temperature sensor are arranged in a bridge structure.

12. The integrated circuit according claim 10, wherein the hotspot detection comprises a comparator configured to receive a first temperature signal from the temperature sensor, and a second temperature signal from the second temperature sensor, and wherein the hotspot detection circuit is configured to transmit the hotspot detection signal based on an output of the comparator.

13. The integrated circuit according to claim 1, comprising a capacitor arranged in parallel or in series with the temperature sensor.

14. The integrated circuit according to claim 1, wherein the protection circuit comprises a pull-down transistor connected between the gate terminal and the source terminal; and wherein the pull-down transistor is configured, upon receipt of the hotspot detection signal by the protection circuit, to turn-on.

15. The integrated circuit according to claim 1, wherein the protection circuit comprises an auxiliary gate interface circuit, and wherein the gate terminal is operatively connected to a control terminal via the auxiliary gate interface circuit;

wherein the auxiliary gate interface circuit is configurable to adjust a voltage applied to the control terminal to be operatively compatible with the gate terminal.

16. The integrated circuit according to claim 15, wherein the auxiliary gate interface circuit is configured to adjust the voltage applied to the control terminal upon receipt by the protection circuit of the hotspot detection signal.

17. The integrated circuit according to claim 15, wherein the auxiliary gate interface circuit comprises an auxiliary gate HEMT and a voltage limiter.

18. The integrated circuit according to claim 1, wherein the hotspot detection circuit further comprises a sense HEMT, the sense HEMT having a smaller active area and/or gate width relative to the III-nitride HEMT.

* * * * *